United States Patent
Wang et al.

(10) Patent No.: US 6,714,268 B2
(45) Date of Patent: Mar. 30, 2004

(54) PIXEL STRUCTURE OF A SUNLIGHT READABLE DISPLAY

(75) Inventors: Wen-Chun Wang, Taichung (TW); Lisen Chuang, Penghu (TW)

(73) Assignee: Industrial Technology Research Institute, Taipei (TW)

( * ) Notice: Subject to any disclaimer, the term of this patent is extended or adjusted under 35 U.S.C. 154(b) by 33 days.

(21) Appl. No.: 10/172,276

(22) Filed: Jun. 13, 2002

(65) Prior Publication Data
US 2003/0193457 A1 Oct. 16, 2003

(30) Foreign Application Priority Data
Apr. 16, 2002 (TW) ........................ 91107688 A

(51) Int. Cl.[7] ................ G02F 1/1368; G09G 3/36
(52) U.S. Cl. ............... 349/48; 349/43; 349/69; 257/40; 257/72; 313/500; 313/505; 345/82; 315/169.3
(58) Field of Search .............. 349/38, 117, 39, 349/43, 48, 69, 110; 257/40, 88, 72, 59; 313/500, 505; 315/169.3; 345/78, 82

(56) References Cited

U.S. PATENT DOCUMENTS

| | | | |
|---|---|---|---|
| 6,165,383 A | 12/2000 | Chou | 252/301 |
| 6,361,885 B1 | 3/2002 | Chou | 428/690 |
| 2002/0093472 A1 * | 7/2002 | Numao | 345/87 |
| 2003/0081158 A1 * | 5/2003 | Li et al. | 349/113 |

* cited by examiner

*Primary Examiner*—Toan Ton
*Assistant Examiner*—Tai Duong
(74) *Attorney, Agent, or Firm*—Troxell Law Office PLLC

(57) ABSTRACT

A display that is readable under direct sunlight comprises a half organic light emitting diode structure and a half reflective liquid crystal display structure. It uses a thin film transistor as a switch to solve the problem of crosstalk between the organic light emitting diode mode and the liquid crystal mode as well as the dc residual problem and has the advantages of both display structures. The data signals in organic light emitting diode mode and liquid crystal mode are controlled by different control systems. By properly selecting liquid crystal material and organic light emitting diode material such that the ranges of the data signals are similar, one data driver can be shared between the two modes.

11 Claims, 4 Drawing Sheets

PIXEL STRUCTURE OF A SUNLIGHT READABLE DISPLAY

FIELD OF THE INVENTION

The present invention relates generally to a pixel structure of an organic light emitting diode (OLED) display and a liquid crystal display (LCD), and more specifically to a pixel structure of a sunlight readable display.

BACKGROUND OF THE INVENTION

Flat-panel displays have become one of the most important electronic products. Among the flat-panel displays, organic light emitting displays have the advantages of self-light emitting, high luminous efficiency, wide viewing angle, fast response speed, high reliability, full color, low-voltage driving, low power consumption and simple fabrication.

Nowadays, there are many kinds of structures and fabrication methods for passive-drive or active-drive organic light emitting display devices. Although the manufacturing process of a conventional passive-drive organic light emitting display device is simple and manufacturing cost is less expensive, the resolution of the display device manufactured is not high enough. It can only make the displays that have small size and low resolution. On the contrary, an active-drive organic light emitting display device using thin film transistors has the advantages of high resolution, low power consumption and low-voltage driving. However, the contrast ratio of a bright state to a dark state of a conventional organic light emitting diode gets worse under direct sunlight. By increasing the brightness of the organic light emitting diode, higher contrast ratio can be obtained but the power consumption is also increased.

Recently, the market for liquid crystal display panels is growing rapidly. High quality liquid crystal displays are therefore produced. Conventional reflective liquid crystal displays are readable under direct sunlight. However, they need front light source under weak light environment and the pixel quality is worse than that of liquid crystal displays with a back light source and displays with self-light emitting.

Therefore, it is necessary to develop displays with high contrast ratio, low power consumption, self-light emitting and good pixel quality.

SUMMARY OF THE INVENTION

This invention has been made to overcome the above-mentioned drawbacks of conventional organic light emitting diode displays and liquid crystal displays. The primary object is to provide a pixel structure of a sunlight readable display. According to the invention, the pixel structure combines a half organic light emitting diode structure and a half reflective liquid crystal display structure so as to have the advantages of both display structures.

The half reflective LCD structure of the invention comprises mainly a glass substrate, a reflective metal layer, a color filter, a liquid crystal layer, a quarter-wave film and a polarizer. The half OLED structure of the invention comprises mainly a glass substrate, a black matrix on the top surface of the glass substrate, a buffer layer on the black matrix, a poly-Si layer on the buffer layer to define the regions of the source and drain electrodes of thin film transistors. A dielectric layer is formed on the poly-Si layer, and a metal gate layer is formed on the dielectric layer to define the region of the gate electrode of a thin film transistor. An intermediate layer is formed on the gate layer, and contact holes are formed in the intermediate layer. A metal layer covers the intermediate layer and a first passivation layer is formed on top of the metal layer. A layer of transparent material is formed on a portion of the passivation layer and defined as an anode layer, and a layer of OLED material is formed on the layer of transparent material and the first passivation layer. A transparent cathode layer is formed on a portion of the layer of the OLED material. A second dielectric layer is then deposited to cover the transparent cathode layer as well as the first dielectric layer, and an ITO pixel electrode layer is formed on the second dielectric layer.

There are two preferred embodiments in the invention. In the first preferred embodiment, the reflective metal layer is formed on the color filter. The display is operated at the organic light emitting diode mode when the light path of the display is downward. In the organic light emitting mode, liquid crystal molecules in the liquid crystal layer are operated at a normally black mode. In the second preferred embodiment, the reflective metal layer is formed on the TFT substrate. The display is operated at the organic light emitting diode mode and liquid crystal molecules in the liquid crystal layer are operated at a normally white mode when the light path of the display is upward.

According to the invention, a thin film transistor is used as a switch to solve the problem of crosstalk between the organic light emitting diode mode and the liquid crystal mode as well as the problem of direct current residual.

In addition, data signals in the organic light emitting diode mode and the liquid crystal mode can be controlled by different control systems because the thin film transistor is used as the switch in the display. By properly selecting liquid crystal material and OLED material so that the ranges of the data signals are similar, only one data driver is needed. This saves the cost of the data driver.

The foregoing and other objects, features, aspects and advantages of the present invention will become better understood from a careful reading of a detailed description provided herein below with appropriate reference to the accompanying drawings.

DETAILED DESCRIPTION OF THE PREFERRED EMBODIMENTS

Figure 1B:
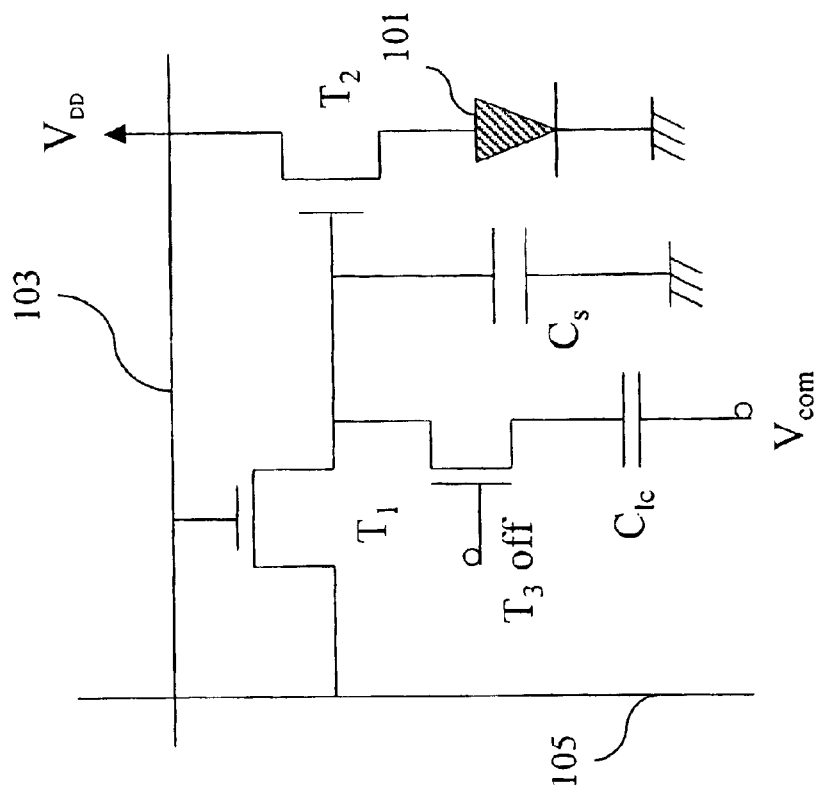
FIG. 1b shows a schematic circuit diagram of a single pixel in the organic light emitting diode mode of the invention where the storage capacitor is connected to the ground.
Figure 1A:
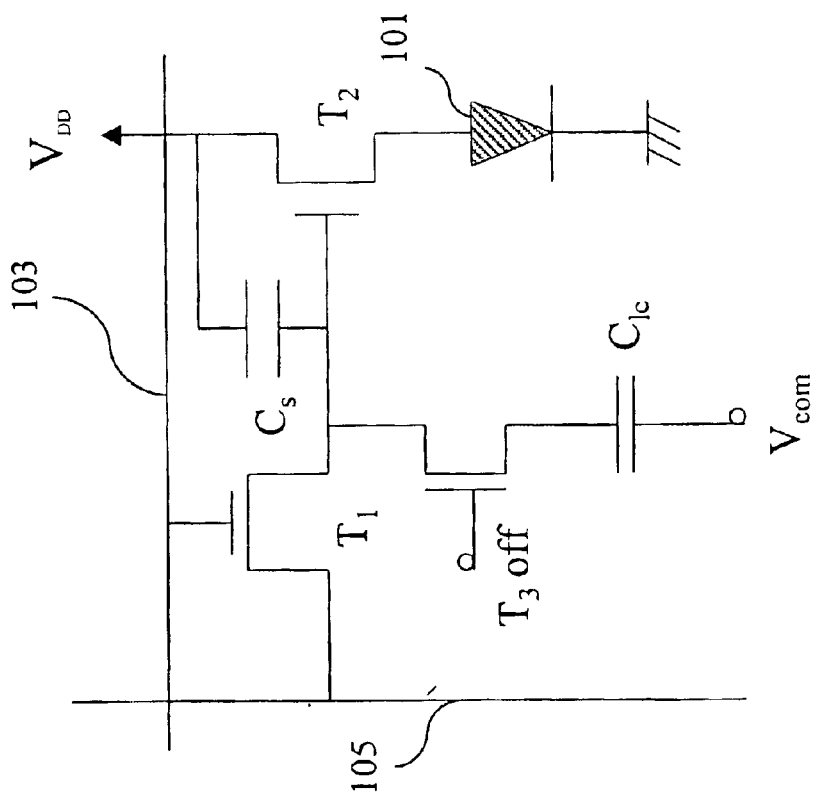
FIG. 1a shows a schematic circuit diagram of a single pixel in the organic light emitting diode mode of the invention where the storage capacitor is connected to the power supply bus $V_{DD}$.

FIG. 1a shows a schematic circuit diagram of a single pixel in the organic light emitting diode mode of the invention in which the storage capacitor Cs is connected to the power supply bus $V_{DD}$. As shown in FIG. 1a, the circuit of a single pixel in an organic light emitting diode mode comprises two thin film transistors (TFT) $T_1$ and $T_2$, a storage capacitor $C_s$, a liquid crystal capacitor $C_{lc}$, an organic light emitting diode display device 101 and a thin film transistor $T_3$. The organic light emitting diode display device 101 is connected to the thin film transistor $T_2$.

Thin film transistors $T_1$, $T_2$ and $T_3$ comprise respectively a source electrode, a drain electrode and a gate electrode. The gate electrode of the TFT $T_1$ comprises a portion of a gate line 103. The source electrode of the TFT $T_1$ is electrically connected to a data line 105 and the drain electrode is electrically connected to the gate electrode of the TFT $T_2$. The gate electrode of the TFT $T_2$ is also electrically connected to one end of the storage capacitor $C_s$. The OLED display device 101 is electrically connected to the drain electrode of the TFT $T_2$. The OLED display device 101 and the TFT $T_2$ are connected in series. The storage capacitor $C_s$ and the TFT $T_1$ are also connected in series. Another end of the storage capacitor Cs is connected to the power supply bus $V_{DD}$.

The source electrode of the TFT $T_3$ is electrically connected to the drain electrode the TFT $T_1$ of and the drain electrode is electrically connected to the liquid crystal capacitor $C_{lc}$. The TFT $T_3$ is used as a switch to solve the problem of crosstalk between the organic light emitting diode mode and the liquid crystal mode as well as a direct current (dc) residual problem. In the organic light emitting diode mode, the TFT $T_3$ is at an OFF state and another end of the liquid crystal capacitor $C_{lc}$ is connected to the common bus $V_{com}$.

FIG. 1b shows a schematic circuit diagram of a single pixel in the organic light emitting diode mode of the invention in which the storage capacitor $C_s$ is connected to the ground. The only difference between FIG. 1a and FIG. 1b is the connection of the storage capacitor $C_s$.

Figure 2B:
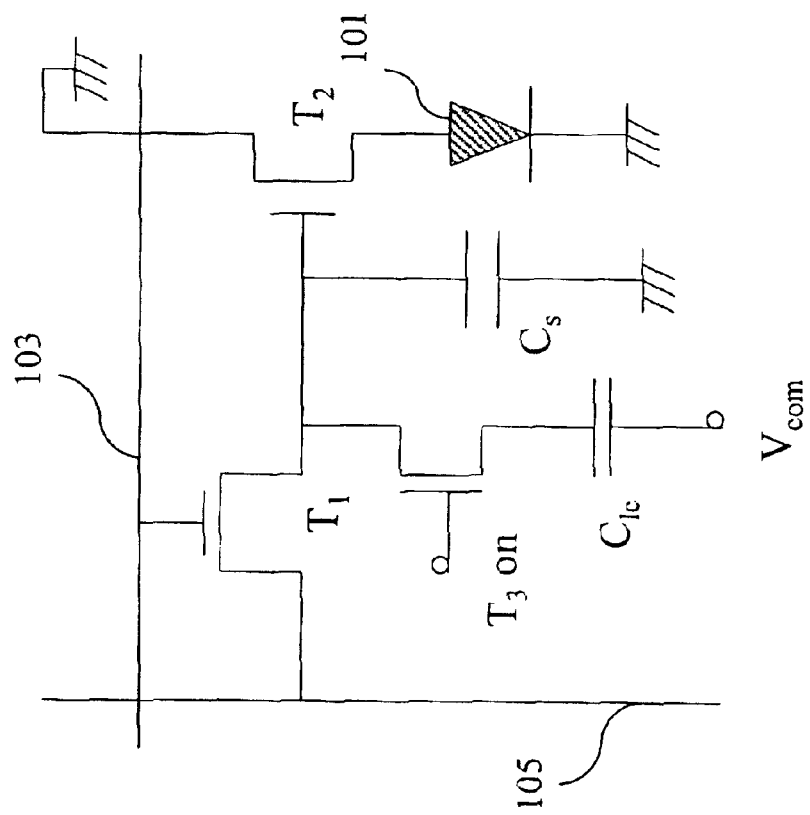
FIG. 2b shows the equivalent circuit diagram of FIG. 1b when the thin film transistor $T_3$ is at an ON state and a single pixel is in the liquid crystal mode of the invention.
Figure 2A:
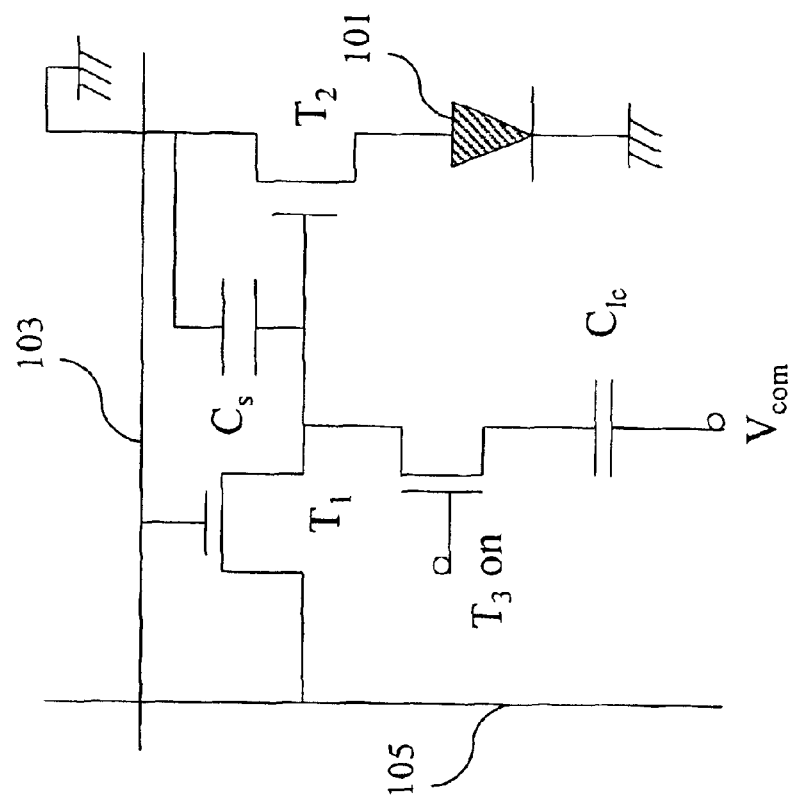
FIG. 2a shows the equivalent circuit diagram of FIG. 1a when the thin film transistor $T_3$ is at an ON state and a single pixel is in the liquid crystal mode of the invention.

As described above, this invention combines a half OLED structure and a half reflective LCD structure. Therefore, when the display of the invention is in the reflective liquid crystal mode, the TFT $T_3$ is at the ON state and the power supply $V_{DD}$ is set to ground. FIGS. 2a and 2b show the equivalent circuit diagrams of a single pixel in the liquid crystal mode of the invention for FIGS. 1a and 2b respectively. This design illustrates that the invention uses a thin film transistor as a switch to solve the problem of crosstalk between the organic light emitting diode mode and the liquid crystal mode as well as the dc residual problem and still has the advantages of both display structures.

Figure 3:
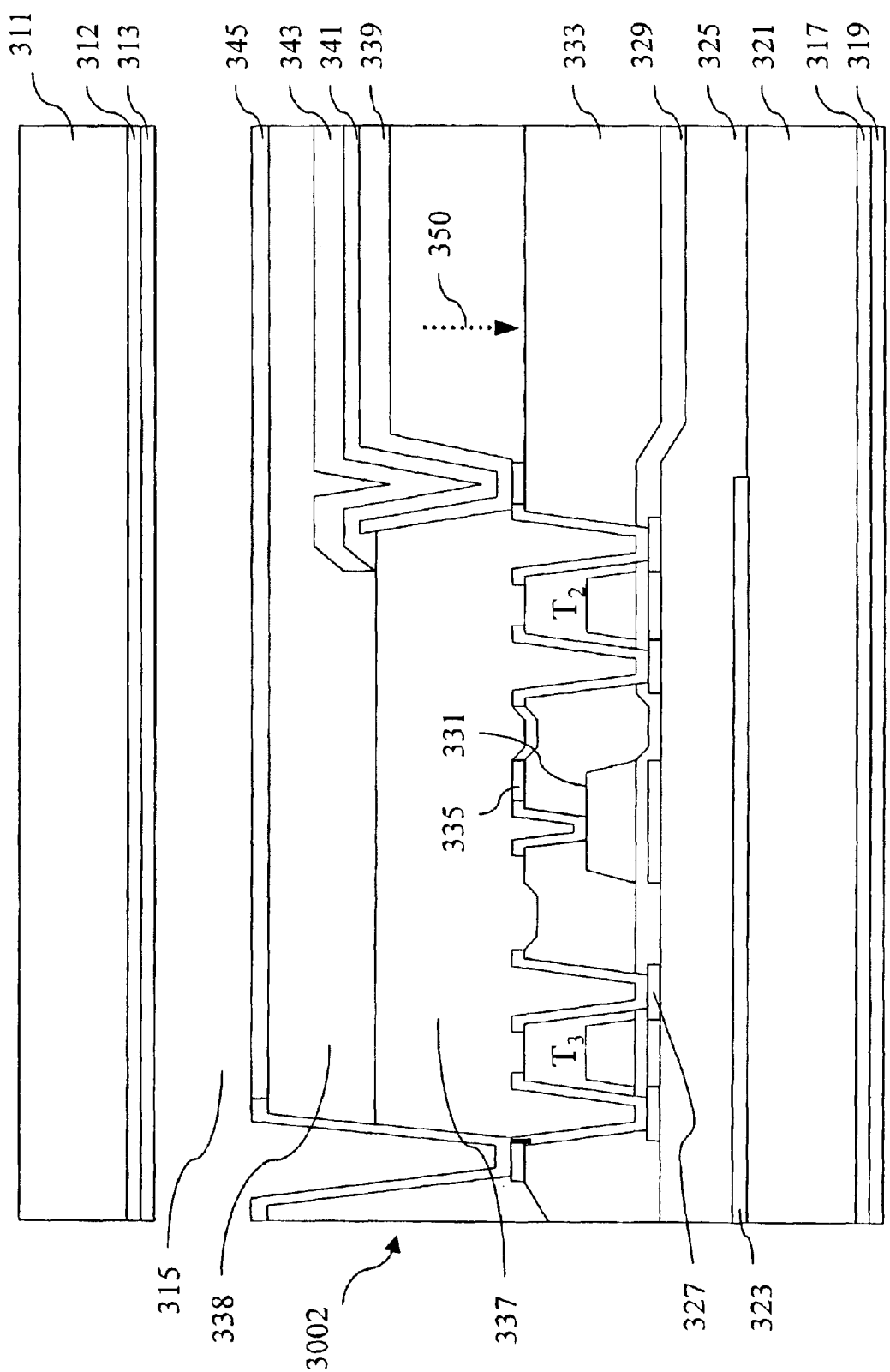
FIG. 3 shows a cross-sectional view of the first preferred embodiment of a pixel structure of a sunlight readable display according to the invention.

FIG. 3 shows a cross-sectional view of the first preferred embodiment of a pixel structure of a sunlight readable display according to the invention. As shown in FIG. 3, a half OLED structure 3002 is included in a half reflective LCD structure. The half OLED structure 3002 comprises, as seen from bottom to top, a glass substrate 321 having top and bottom surfaces, a black matrix 323 on the top surface of the glass substrate 321 and under the thin film transistors $T_2$ and $T_3$, a buffer layer 325 on the black matrix 323 and on the top surface of the glass substrate 321, and a poly-Si layer 327 on the buffer layer 325 to define the regions of source and drain electrodes of the TFT $T_2$ and the regions of source and drain electrodes of the TFT $T_3$. A dielectric layer 329 is formed on the poly-Si layer 327, and a gate layer 331 is formed by metal material on the dielectric layer 329 to define the regions of gate electrodes of the TFT $T_2$ and the TFT $T_3$ and one counter electrode of $C_s$.

An intermediate layer 333 is formed on the gate layer 331 and a metal layer 335 covers the intermediate layer 333. Contact holes are formed in the intermediate layer 333 for connecting the metal layer 335 and the gate layer 331 as well as the poly-Si layer 327. A first passivation layer 337 is first formed by photoresist or non-photoresist material and then a portion of the first passivation layer 337 is etched by photolithography process to define the region of drain electrode of the TFT $T_2$. A layer of transparent material 339, such as indium-tin-oxide (ITO), is formed on a portion of the first passivation layer 337 to define an anode layer which is electrically connected to the drain electrode of the TFT $T_2$. A layer of OLED material 341 is formed on the layer of the transparent material 339 and the first passivation layer 337, and a transparent cathode layer 343 is formed on a portion of the layer of the OLED material 341. A second passivation layer 338 is deposited to cover the first passivation layer 337 and the transparent cathode layer 343, and an ITO pixel electrode layer 345 is formed on the second passivation layer 338. The ITO pixel electrode layer 345 is electrically connected to the drain electrode of the TFT $T_3$.

The half reflective LCD structure comprises a polarizer 319, a quarter-wave film 317 being formed on the polarizer 319 and beneath the bottom surface of the glass substrate 321 of the half OLED structure 3002. A liquid crystal layer 315 is disposed on the top of the ITO pixel electrode layer 345 of the half OLED structure 3002, and a color filter 313 is formed above the liquid crystal layer 315. The color filter 313 is formed underneath a reflective metal layer 312 which formed on the bottom surface of a glass substrate 311.

Accordingly, this invention combines a half OLED structure and a half reflective LCD structure to form a pixel structure of a sunlight readable display. In the first preferred embodiment, when the OLED display device is at the ON state, the light path 350 is downward and liquid crystal molecules in the liquid crystal layer 315 are operated at the normally black mode. When the OLED display device is at the OFF state, the OLED display device is transparent and liquid crystal molecules are operated normally.

Figure 4:
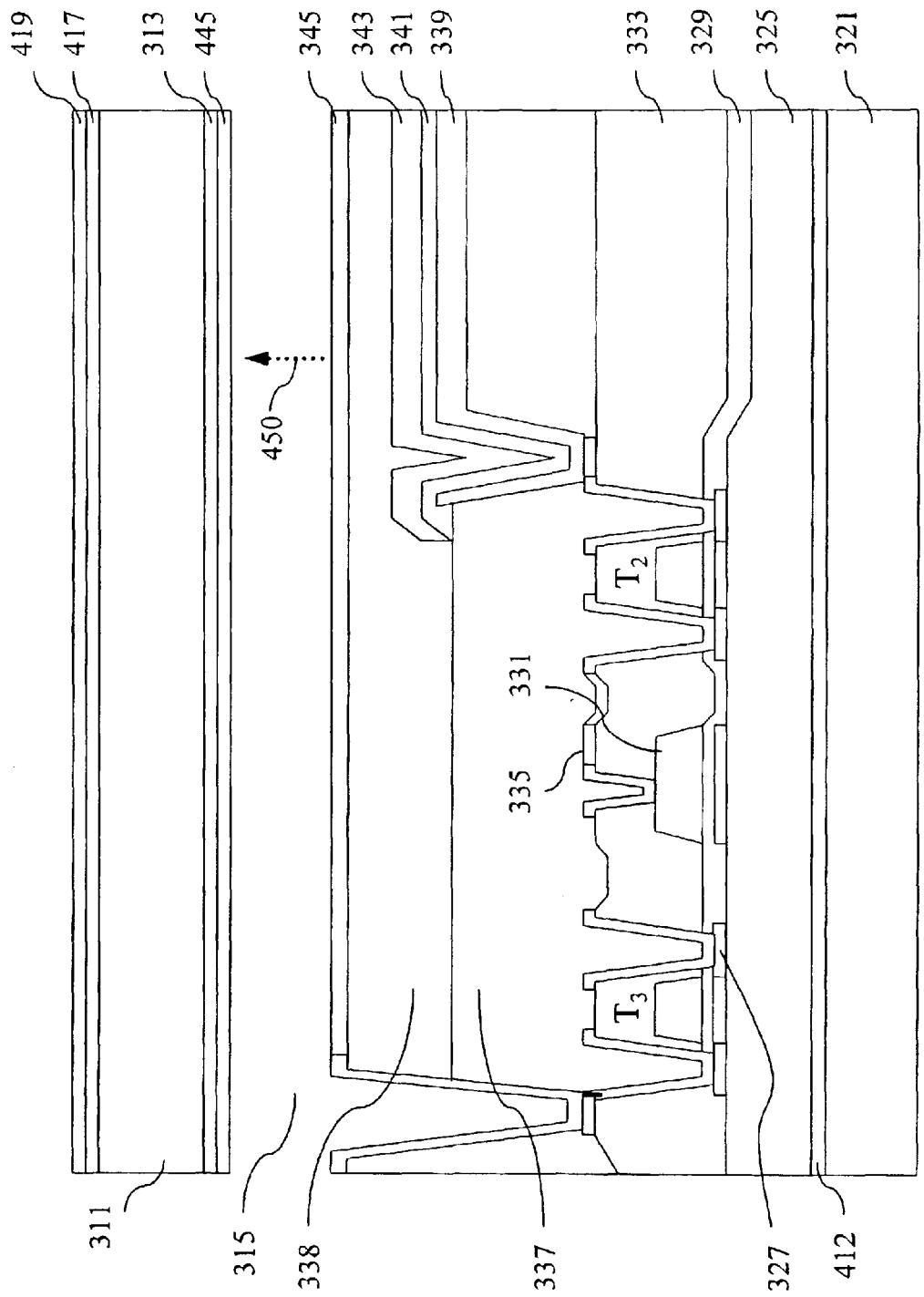
FIG. 4 shows a cross-sectional view of the second preferred embodiment of a pixel structure of a sunlight readable display according to the invention.

FIG. 4 shows a cross-sectional view of the second preferred embodiment of a pixel structure of a sunlight readable display according to the invention. Referring to FIG. 4, the quarter-wave film 417 and the polarizer 419 are formed on the glass substrate 311 of the half reflective LCD structure. The reflective metal layer 412 is formed between the buffer layer 325 and the top surface of the glass substrate 321 of the half OLED structure. The black matrix 323 in the first preferred embodiment is eliminated and a transparent electrode layer 445, such as indium-tin-oxide, is deposited between the liquid crystal layer 315 and the color filter 313.

Accordingly, the second preferred embodiment also combines a half OLED structure and a half reflective LCD structure to form another pixel structure of a sunlight readable display. In this embodiment, when the OLED display device is at the ON state, the light path 450 is upward, the liquid crystal layer 315 is transparent and liquid crystal molecules in the liquid crystal layer 315 are operated at the normally white mode. When the OLED display device is at the OFF state, the OLED display device is transparent and liquid crystal molecules are operated normally.

In the preferred embodiments of the invention, the regions of source electrode and drain electrode of the TFT $T_2$ are formed after ion implantation and doped with $P^+$-type dopant. The TFT $T_2$ is used to provide current to the OLED display device and serves as an active-drive device. The regions of source and drain electrodes of the TFT $T_3$ are formed after ion implantation and doped with P⁺-type or N⁺-type dopant. The TFT $T_3$ is used as a switch to solve the problem of crosstalk between the organic light emitting diode mode and the liquid crystal mode as well as the problem of direct current residual.

The organic light emitting diode can be a red, green, blue or white OLED, a polymer light emitting diode, or a polymer lighting emission display (PLED). The material for the passivation layer can be a photoresist or non-photoresist material. The black matrix is a metal layer, such as a chromium (Cr) metal layer, an oxide chromium layer (CrOx), or a black resin. The reflective metal layer can be an aluminum or a silver metal layer.

As far as issues associated the Gamma curve in the organic light emitting diode mode or the liquid crystal mode, they can be resolved by having data in the two modes controlled by different control systems because the TFT $T_3$ is used as a switch. By properly selecting the liquid crystal material and OLED material so that the ranges of the data signals are similar, one data driver can be shared between the two modes. Therefore, the cost for the data driver is reduced.

In summary, this invention combines a half OLED structure and a half reflective LCD structure to form a display that is readable under direct sunlight and has advantages of high contrast ratio, low power consumption, self-light emitting and good pixel quality. The invention uses a thin film transistor as a switch to solve the problem of crosstalk between the organic light emitting diode mode and the liquid crystal mode as well as the dc residual problem and still has the advantages of both display structures.

Although the present invention has been described with reference to the preferred embodiments, it will be understood that the invention is not limited to the details described thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. A pixel structure of a sunlight readable display, comprising:

a first thin film transistor comprising a source electrode, a drain electrode and a gate electrode;

a second thin film transistor comprising a source electrode, a drain electrode and a gate electrode, said gate electrode of said second thin film transistor being electrically connected to said drain electrode of said first thin film transistor;

a first storage capacitor having one end electrically connected to said gate electrode of said second thin film transistor;

a third thin film transistor comprising a source electrode, a drain electrode and a gate electrode, said drain electrode of said third thin film transistor being electrically connected to said drain electrode of said first thin film transistor;

a second storage capacitor having one end electrically connected to said source electrode of said third thin film transistor and another end connected to a common bus, said second storage capacitor being a liquid crystal capacitor; and an organic light emitting diode display device electrically connected to said drain electrode of said second thin film transistor, said organic light emitting diode display device comprising a half organic light emitting diode display structure and a half reflective liquid crystal display structure;

wherein said display is in an organic light emitting diode mode when said third thin film transistor is at an OFF state, and said display is in a liquid crystal mode when said third thin film transistor is at an ON state.

2. The pixel structure of a sunlight readable display as claimed in claim 1, said first storage capacitor having another end electrically connected to either a power supply bus or ground.

3. The pixel structure of a sunlight readable display as claimed in claim 1, said second thin film transistor being an active-drive device for providing current to said organic light emitting diode display device.

4. The pixel structure of a sunlight readable display as claimed in claim 1, regions of said source and drain electrodes of said third thin film transistor comprising P⁺-type or N⁺-type dopant, and regions of said source and drain electrodes of said second thin film transistor comprising P⁺-type dopant.

5. The pixel structure of a sunlight readable display as claimed in claim 1, said organic light emitting diode display device comprising an organic light emitting diode, a polymer light emitting diode, or a polymer lighting emission display.

6. The pixel structure of a sunlight readable display as claimed in claim 1, said organic light emitting diode display device comprising:

a lower glass substrate having top and bottom surfaces;

a quarter-wave film formed beneath said lower glass substrate;

a polarizer formed beneath said quarter-wave film;

a black matrix formed on said top surface of said lower glass substrate;

a buffer layer formed on said black matrix and said top surface of said lower glass substrate;

a poly-Si layer formed on said buffer layer for defining regions of said source and drain electrodes of said second and third thin film transistors;

a dielectric layer formed on said poly-Si layer;

a gate layer formed on said dielectric layer for defining regions of said gate electrodes of said second and third thin film transistors and for defining regions of one counter electrode of said first storage capacitor;

an intermediate layer formed on said gate layer and said poly-Si layer, said intermediate layer having a plurality of contact holes;

a metal layer formed on said intermediate layer;

a first passivation layer covering said metal layer;

an anode layer of transparent material formed on a portion of said first passivation layer, said anode layer being electrically connected to said drain electrode of said second thin film transistor;

a layer of organic light emitting diode material formed on said anode layer of transparent material and a portion of said first passivation layer;

a transparent cathode layer formed on said layer of organic light emitting diode material;

a second passivation layer covering said transparent cathode layer and said first passiviation layer;

a pixel electrode layer formed on said second passivation layer and connected to said drain electrode of said third thin film transistor;

an upper glass substrate having top and bottom surfaces;

a reflective metal layer formed beneath said bottom surface of said upper glass substrate;

a color filter formed beneath said reflective metal layer; and a liquid crystal layer disposed between said color filter and said pixel electrode layer.

7. The pixel structure of a sunlight readable display as claimed in claim 6, said pixel electrode layer being a transparent electrode layer.

8. The pixel structure of a sunlight readable display as claimed in claim 6, wherein when said organic light emitting diode display device is at an ON state, light path in said layer of organic light emitting diode is downward and liquid crystal molecules in said liquid crystal layer are operated at a normally black mode; and when said organic light emitting diode display device is at an OFF state, said organic light emitting diode display device is transparent and liquid crystal molecules in said liquid crystal layer are operated normally.

9. The pixel structure of a sunlight readable display as claimed in claim 1, said organic light emitting diode display device comprising:

a lower glass substrate;

a reflective metal layer formed on said lower glass substrate;

a buffer layer formed on said reflective metal layer;

a poly-Si layer formed on said buffer layer for defining regions of said source and drain electrodes of said second and third thin film transistors;

a dielectric layer formed on said poly-Si layer;

a gate layer formed on said dielectric layer for defining regions of said gate electrodes of said second and third thin film transistors and for defining regions of one counter electrode of said first storage capacitor;

an intermediate layer formed on said gate layer and said poly-Si layer, said intermediate layer having a plurality of contact holes;

a metal layer formed on said intermediate layer;

a first passivation layer covering said metal layer and said intermediate layer;

an anode layer of transparent material formed on a portion of said first passivation layer, said anode layer being electrically connected to said drain electrode of said second thin film transistor;

a layer of organic light emitting diode material formed on said anode layer of transparent material and a portion of said first passivation layer;

a transparent cathode layer formed on said layer of organic light emitting diode material;

a second passivation layer covering said transparent cathode layer and said first passiviation layer;

a pixel electrode layer formed on said second passivation layer and connected to said drain electrode of said third thin film transistor;

an upper glass substrate having top and bottom surfaces;

a color filter formed beneath said bottom surface of said upper glass substrate;

a transparent electrode layer formed beneath said color filter;

a quarter-wave film formed on said top surface of said upper glass substrate;

a polarizer film formed on said quarter-wave film; and a liquid crystal layer disposed between said transparent electrode layer and said pixel electrode layer.

10. The pixel structure of a sunlight readable display as claimed in claim 9, said pixel electrode layer being a transparent electrode layer.

11. The pixel structure of a sunlight readable display as claimed in claim 9, wherein when said organic light emitting diode display device is at an ON state, light path in said liquid crystal layer is upward, said liquid crystal layer is transparent and liquid crystal molecules in said liquid crystal layer are operated at a normally white mode; and when said organic light emitting diode display device is at an OFF state, said organic light emitting diode display device is transparent and liquid crystal molecules in said liquid crystal layer are operated normally.

* * * * *